United States Patent
Naum et al.

(10) Patent No.: US 7,816,663 B2
(45) Date of Patent: Oct. 19, 2010

(54) ORANGE-YELLOW SILICATE PHOSPHOR AND WARM WHITE SEMICONDUCTOR USING SAME

(75) Inventors: Soshchin Naum, Changhua (TW); Wei-Hung Lo, 4F., No. 10, Lane 95, Sanmin Rd., Songshan District, Taipei City (TW); Chi-Ruei Tsai, Taipei (TW)

(73) Assignees: Wei-Hung Lo, Taipei (TW); Chen-Pei Hsu, Sanchong (TW)

( * ) Notice: Subject to any disclaimer, the term of this patent is extended or adjusted under 35 U.S.C. 154(b) by 137 days.

(21) Appl. No.: 12/315,663

(22) Filed: Dec. 5, 2008

(65) Prior Publication Data

US 2009/0152575 A1 Jun. 18, 2009

(30) Foreign Application Priority Data

Dec. 12, 2007 (TW) ............................... 96147515 A

(51) Int. Cl.
*H01L 33/50* (2010.01)

(52) U.S. Cl. ............................... 257/13; 257/94; 257/98; 252/301.4 F

(58) Field of Classification Search ................... 257/13, 257/94, 98, 103, E33.061; 252/301.4 R, 252/301.4 F See application file for complete search history.

(56) References Cited

U.S. PATENT DOCUMENTS 7,713,442 B2 * 5/2010 Tian et al. ............. 252/301.4 R

* cited by examiner

*Primary Examiner*—Minh-Loan T Tran
*Assistant Examiner*—W. Wendy Kuo
(74) *Attorney, Agent, or Firm*—Muncy, Geissler, Olds & Lowe, PLLC

(57) ABSTRACT

A silicate phosphor prepared from $Mg_2Me^{+2}_{0.5}Ln_3Si_{2.5}O_{12-2y}N^{-3}_yF^{-1}_y$, in which $Me^{+2}$=Ca, Sr, Ba, Ln=Sc, Lu, Er, Ho, excited by one single ion or an ion pair of d, f-elements such as $Ak^{+n}$=$Cu^{+1}$, $Ce^{+3}$, $Eu^{+2}$, $Ag^{+1}$, $Mn^{+2}$. The phosphor has a cubic garnet architecture prepared by solid phase synthesis, and radiates at green, green-yellow, yellow-orange spectrum regions. When mixed with $(Y,Gd,Ce)_3Al_5O_{12}$ substrate-based phosphor, the compound mixture has warm white radiation and color temperature T<4000K with high luminous intensity and high luminescence efficiency. The invention also provides a warm white semiconductor using the silicate phosphor.

14 Claims, No Drawings

US 7,816,663 B2

ORANGE-YELLOW SILICATE PHOSPHOR AND WARM WHITE SEMICONDUCTOR USING SAME

BACKGROUND OF THE INVENTION

1. Field of the Invention

The present invention relates to materials science and more particularly, to the application of phosphor to the fabrication of a warm white luminous semiconductor. This luminous semiconductor uses a spectrum conversion layer prepared from a light-permeable polymeric material and an inorganic phosphor powder distributed therein. The phosphor is excited by a short wave radiation, for example, violet or blue light and a long wave radiation, for example, yellow-orange light, and combined with a first order short wave to produce white light of which the optical parameter, for example, color temperature relies upon the spectrum parameter of the phosphor.

2. Description of the Related Art

More than 10 years ago, researchers at Nichia Chemical Industries in Japan announced the development of a continuously operating laser diode that emits light at blue wavelengths (see S. Nakamura et. al and Blue laser, Sringer Verlag, Berlin 1997). Based on this research, new blue laser architectures have been developed for many commercial applications. Before Nakamura et. al, many effective luminous semiconductors (light emitting diodes) researches were known (see V. Abramov et. USSR. 1977). InGaN heterostructure-based blue LED becomes one of important semiconductor luminous elements. During 1998~2000, many effective white LEDs were developed (see Schimisu et. al's U.S. Pat. No. 5,988,925 Jan. 7, 1999 and E. Ellens et. al's U.S. Pat. No. 6,670,714 Dec. 30, 2003). These architectures employ two basic concepts. One concept is the technique of combining two compensation colors, i.e. blue and yellow, subject to the Newton's law of complementary colors, to create white radiator. This technique was intensively applied to create CRT screen for black-and-white TV. The other concept is the use of semiconductor nitride heterostructure with yellow phosphor. The heterostructure radiates blue light. The phosphor is excited by wide band light wave. When putting the inorganic phosphor into optical contact with the blue heterostructure, it absorbs a certain fraction of the blue light radiation from the blue heterostructure and emits light at yellow wavelengths. At this time, the blue light that is not absorbed by the phosphor is combined with the yellow radiation, producing white light.

These white semiconductor light sources have some particular properties, such as: 1. When half angle $2\theta=10\sim120°$, the radiation intensity is as high as several tens or several hundreds of candelas; 2. White radiation has high lumen flux, 1 several tens of lumens on the area of one heterostructure; 3. The specific color temperature of the semiconductor luminous radiator can be adjusted from T=12000K through T=4000~5000K.

According to the characteristics of radiation spectra, white LEDs, based on blue light and yellow light, have two spectrum maximum values. These white LEDs are called two-dimensional light emitting compositions (see N. Soschin. "LED and lasers", N1-2, 2002). More 10 years ago, the phosphor based on inorganic powder type YAG (yttrium aluminum garnet) substrate, excited by cerium, and had stoichiometric equation $(Y,Gd,Ce)_3Al_5O_{12}$. This phosphor was intensively used in electronic radiographic apparatus (see C. Schionoya et "Handbook of Phosphors". CBC precc NY, 1999.). For LED application, Gd ion is added to make a modification.

In $(Y,Gd,Ce)_3Al_5O_{12}$, modifying the spectrum composition of $Ce^{+3}$ cause shift of the position of the spectrum maximum value $\lambda=528\sim562$ nm. When the content of Gd ion reaches 0.2 atomic fraction, the radiation spectrum energy is shifted to $\lambda=568$ nm. However, the aforesaid phosphor cannot achieve maximum radiation shift $\lambda>569$ nm. In 2005 (see N. Soschin et. al and US 2005 0088077 A1 patent application), the applicant of the present inventor studied the material of $(Y,Gd,Ce)_3Al_5O_{12}$:Pr. By means of adding $Pr^{+3}$, the material radiates at $\lambda=610$ nm. The applicant of the present invention uses this patent as a reference. Although this material can produce orange light, it still has a substantial drawback, i.e., low radiation quantum efficiency. Further, in known phosphors, the fraction of red-orange light is low.

In 2006, the applicant of the present invention studied the chemical formula of a phosphor composition having garnet crystal architecture. When compared with the chemical formula of conventional synthetic $Ln_3Al_5O_{12}$ garnet, natural $Me^{+2}_3Me^{+3}_2Si_3O_{12}$ garnet show similar applicability. Based on this garnet architecture, the unit lattice contains the atomic number of z=20 atoms. These atoms have respective coordinates. With respect to the three $Me^{+2}$, the coordination number is K=8. At this time, oxygen ion forms the initial range of coordination, wherein $Me^{+2}=Mg^{+2}, Sr^{+2}, Ca^{+2}$, or $Ba^{+2}$ in few cases. $Me^{+3}$ includes VIIIB group +3 elements, such as $Fe^{+3}$, or rare earth +3 ion $Me^{+3}=Ln^{+3}=Y^{+3}, Gd^{+3}, Lu^{+3}$. Normally, the coordinate range of these ions is eight $O^{-2}$. In the gap between big size ions $Me^{+2}$ and $Me^{+3}$, small size IVA group element ions exist, such as $Si^{+4}, Ge^{+4}, Sn^{+4}$. These ions have a small radius, and can be coordinated by a small number of oxygen ions, usually, $K_{Si}=4$.

Since 2005, the applicant of the present invention has synthesized many luminous materials having $Me^{+2}_3Ln_2Si_3O_{12}$ garnet natural stoichiometric equation. In this natural architecture, there are two lattice nodes. These lattice nodes allow allocation of activator ions, and have different degrees of oxidation, $Ak^{+2}$ and $Ak^{+3}$. The applicant of the present invention identified these activator ion pairs, such as $Eu^{+2}$ and $Ce^{+3}$; $Eu^{+3}$ and $Pr^{+3}$; $Sm^{+2}$ and $Pr^{+3}$; $Eu^{+3}$ and $Dy^{+3}$. The properties of these luminous compounds were described in a report issued by the present invention in 2007 (see N. Soschin V Conf. of $A_{III}B_V$ Moscow, 2007, h.) ($A_{III}B_V$ Moscow, January, 2007).

Specialists from "General Electric" (see F. Srivastava et and US pat 2006 284196 Dec. 21, 2006.) invented patented phosphor composition $(Mg, Ca)_3Ln_2SiO_{12}$, excited by $Ce^{+3}$. This phosphor has the advantages of: 1. orange-red luminous spectrum maximum value $\lambda=620$-640 nm; 2. high absorption of first order blue radiation of semiconductor heterostructure; 3. low temperature preparation method.

The aforesaid silicate-garnet phosphor is not widely used for different applications due to certain drawbacks. The first drawback is its high luminous spectrum half-wave width, $\lambda_{0.5}\geq=115$ nm and low radiation lumen equivalent value $Q_L$. Because $\lambda=640$ nm radiation spectrum shifts toward $\lambda>720$ nm red wavelengths. This region is not sensitive to human eyes. The total radiation lumen equivalent value of this phosphor does not surpass $Q_L=180\sim200$ lm/W. This value is lower than the radiation lumen equivalent value of $(Y,Gd,Ce)_3Al_5O_{12}$ synthesized garnet $Q_L\approx290\sim360$ lm/W.

The second drawback is that, having a LED produce white or warm white radiation requires a radiation at the spectrum region $\lambda=620\sim640$ nm, therefore, when comparing the proposed phosphor with standard garnet, a big fraction (over 50%) is required.

The third drawback is that due to a great size difference between the substrate ion $Ln^{+3}(D_{Ln}=0.86 A)$ and the activator ion $Ce^{+3}$ ($D_{Ce}$=1.12 A) and the concentration limitation of $Ce^{+3}$ in the lattice $[Ce^{+3}] \leq 0.01$ atomic fraction, the phosphor has a low radiation quantum efficiency, not suitable for creating a warm white LED having high radiation intensity.

SUMMARY OF THE INVENTION

The present invention has been accomplished under the circumstances in view. It is therefore the main object of the present invention to provide a high-performance yellow-orange luminous silicate phosphor, which eliminates the drawbacks of the aforesaid prior art techniques.

It is another object of the present invention to provide a high-performance yellow-orange luminous silicate phosphor, which substantially improves the material radiation efficiency, i.e., the lumen equivalent value.

It is still another object of the present invention to provide a high-performance yellow-orange luminous silicate phosphor, which has high thermal stability when the temperature surpasses 100° C.

It is still another object of the present invention to provide a high-performance yellow-orange luminous silicate phosphor, which allows modification of its radiation spectrum for use to make new type materials that radiate at green-yellow, yellow-orange and orange-red visible spectrum regions.

It is still another object of the present invention to provide a high-performance yellow-orange luminous silicate phosphor, which greatly reduces the consumption of requisite $Lu_2O_3$, thereby reducing the material cost.

It is still another object of the present invention to provide a warm white LED, which uses a phosphor compound of the high-performance yellow-orange luminous silicate phosphor and garnet phosphor to produce warm white radiation.

To achieve these and other objects of the present invention, a yellow-orange silicate phosphor comprises a silicon oxide substrate having garnet crystal architecture and excited by d-element. The silicon oxide substrate has the stoichiometric equation $Mg_2Me^{+2}_{0.5}Ln_3Si_{2.5}O_{12-2y}N_yF_y:Ak_x^{+n}$ in which Ln=Sc and/or Lu and/or Yb and/or Er and/or Ho; $Me^{+2}$=Ca and/or Sr and/or Ba. The phosphor is excited d, f-element ions that came from $Ak^{+n}=Cu^{+1}$, $Ce^{+3}$, $Eu^{+2}$, $Ag^{+1}$, $Mn^{+2}$, and formed of one single element or a pair of elements, i.e., $Cu^{+1}+Ce^{+3}$, $Cu^{+1}+Mn^{+2}$ or $Ag^{+1}+Ce^{+3}$. The phosphor produces a yellow-orange luminance radiation at a specific wavelength when excited by the shortwave light of a nitride semiconductor heterostructure, and at the same time these two radiations are mixed to produce warm white light.

To achieve these and other objects of the present invention, a warm white LED comprises a blue luminescence semiconductor nitride heterostructure and a phosphor compound kept in optical contact with the blue luminescence semiconductor nitride heterostructure. The blue luminescence semiconductor nitride heterostructure radiates at $\lambda$=410~470 nm. The phosphor compound is a mixture of the aforesaid yellow-orange silicate phosphor and a garnet phosphor, and capable of producing a warm white radiation.

DETAILED DESCRIPTION OF THE PREFERRED EMBODIMENT

At first, the object of the present invention is to eliminate the drawbacks of the aforesaid conventional phosphor and warm-white LED. To achieve this object, the yellow-orange silicate phosphor is prepared subject to: using a silicon oxide substrate having a garnet crystal architecture and excited by d-element, characterized in that the phosphor substrate has the stoichiometric equation $Mg_2Me^{+2}_{0.5}Ln_3Si_{2.5}O_{12-2y}N_yF_y$: $Ak_x^{+n}$ in which Ln=Sc and/or Lu and/or Yb and/or Er and/or Ho; $Me^{+2}$=Ca and/or Sr and/or Ba. The phosphor is excited d, f-element ions that came from $Ak^{+n}=Cu^{+1}$, $Ce^{+3}$, $Eu^{+2}$, $Ag^{+1}$, $Mn^{+2}$, and formed of one single element or a pair of elements, i.e., $Cu^{+1}+Ce^{+3}$, $Cu^{+1}+Mn^{+2}$ or $Ag^{+1}Ce^{+3}$; the phosphor produces a yellow-orange luminance radiation at a specific wavelength when excited by the shortwave light of a nitride semiconductor heterostructure, and at the same time these two radiations are mixed to produce warm white light;

wherein the stoichiometric index of the stoichiometric equation is x=0.0001~0.1, y=0.001~0.2;

wherein the specific wavelength is $\lambda$=590 nm;

wherein the specific color temperature of the warm white light is T$\leq$5000K;

wherein the cubic lattice of the substrate of the phosphor added with Ln=Lu and/or Eb and/or Er and/or Ho has lattice parameter a$\leq$11.95 A, stoichiometric index value y$\geq$0.1; or stoichiometric index value y<0.1 and lattice parameter a$\leq$11.9 A when added with Ln=Lu and/or Sc;

wherein the concentration of the d-element $Ak^{+n}$ that excites the substrate of the phosphor is x=0.0001~0.1 atomic fraction wherein n=1, 2 or 3 and under this condition, the after-glow duration is $\tau \leq$1 μs when the phosphor is excited by $Ce^{+3}$ and $Cu^{+1}$ or $\tau \geq$1 μs when excited by $Mn^{+2}$ and $Eu^{+2}$;

wherein when the phosphor is excited by the shortwave $\lambda$=365~475 nm of InGaN heterostructure, the long wave shift $\Delta\lambda$=55~145 nm is proportional to the maximum excitation wave value.

wherein the phosphor has the stoichiometric equation composition of $Mg_{2.5}Lu_{2.5}Ce_{0.03}Sc_{0.47}Si_{2.5}O_{11.86}N_{0.07}F_{0.07}$, capable of producing wideband orange-yellow photoluminescence $\lambda$=600 nm and half wave radiation $\lambda$=120 nm;

wherein the phosphor has the stoichiometric equation $Mg_2Ca_{0.48}Eu_{0.02}Lu_{2.89}Sc_{0.21}Si_{2.5}O_{11.94}N^{-3}_{0.03}F^{-1}_{0.03}$ of dark orange-yellow powder and is excited by the shortwave of nitride heterostructure to provide orange-yellow color of the maximum spectrum value $\lambda$=620 nm;

wherein the phosphor has the stoichiometric equation composition of $Mg_2Sr_{0.5}Lu_{2.95}Sc_{0.05}Si_{2.5}O_{11.96}N^{-3}_{0.02}F^{-1}_{0.02}$ and is excited by the shortwave $\lambda$=465 nm to provide red-orange radiation of the maximum spectrum value $\lambda$=640 nm.

The physical and chemical properties of the phosphor will be described hereinafter. At first, it is to be understood that the stoichiometric equation of the phosphor prepared according to the present invention is quite different from the known equation that uses natural $SiO_2$ as the substrate and, $Me^{+2}_3Me^{+3}_2Si_3O_{12}$ shows the ratio of 3:2:3:12. According to the present invention, $Me^{+2}_{2.5}Me^{+3}_2Si_{2.5}O_{12}$ shows the ratio of 2.5:3:2.5:12. At this time, the total atomic number in one lattice unit remains at 20 units. The proportion of $Me^{+3}$ in the composition reduces the mass fraction of the silica mass in the garnet, thereby raising the material melting point and improving the material synthesis. This is one of the advantages of the material provided by the present invention.

At the second place, the material provided by the present invention contains $N^{-3}$ and $F^{-1}$ that have electric charges different from oxygen ions and that show an effect on various ion radiation. Substitutes for different valence in the ions proceed subject to the illustration: $O^{-2}_0 + O^{-2}_0 = N^{-3}_0 + F^{-1}_0$. The total amount of substitution is 2y, and the stoichiometric index varies within 0.001$\leq$y$\leq$0.2. The substitution of different valence does not change the total charge in the garnet lattice unit and can enhance the molecular mass of the compound. In consequence, it affects the constant value of the chemical bond in the compound lattice. Chemical bonds with large molecular mass produce a relatively higher frequency photon-particulate oscillation to transfer thermal stress in the lattice.

At the third place, the silicate garnet equation is a complex type, i.e., +2 and +3 anions in the equation include various ions. Thus, the greater size of $Ca^{+2}$, $Sr^{+2}$, more particularly $Ba^{+2}$ occupies the major part of $Me^{+2}$. This small size $Mg^{+2}$ (D=0.58 A) is partially substituted by the ions of $Ca^{+2}$(D=1 A), $Sr^{+2}$ (D=1.08 A), $Ba^{+2}$(D=1.16 A), facilitating filling of $Eu^{+2}$ or other activator ions with relatively greater radius in the lattice. The ion substitute of the rare earth element Ln that substitutes for the second anion is not the whole of the total stoichiometry, but about 25% of the whole. The substitute of different valent can expand at a certain degree the Lu garnet lattice of the prime model proposed subject to the present invention. Because the ionic radius of $Lu^{+3}$(D=0.86 A) in the lattice is not great, allocation of activator ion $Ce^{+3}$(D=1.12 A) is difficult to achieve, and the lattice architecture parameters are affected. For example, the parameter of "volume of isomorphous crystal" determines the phosphor radiation strength extreme and the proportional relationship between linear (or non-linear) radiation and excitation power.

In the lattice proposed by the present invention, big size ion, such as Er(D=0.92 A) or Ho(D=0.94 A) is used to substitute for Lu, enhancing the solubility of the activator ion $Ce^{+3}$ by 25~45%. According to the present invention, using Sc(D=0.85 A) to substitute for Lu improves the thermal stability of phosphate substrate and as the same time, assuring a relatively higher temperature during transition of crystal phase into non-crystal glass form.

At the fourth place, the most important superiority of the silicate garnet proposed according to the present invention is its various variations subject to different activators. As indicated in the patented prime model, the invention uses d- or d-f electronic state excitation ion pair to substitute one single excitation ion $Ce^{+3}$. The related ions include $Cu^{+1}$, $Ce^{+3}$(4d), $Eu^{+2}$($4f^75^0$), $Mn^{+2}$.

In the aforesaid phosphor provided by the present invention, there are luminescent chromaticity control means. Exemplars of these control means are outlined hereinafter. The first luminescent chromaticity control means is the use of big size anion $Ca^{+2}$, $Sr^{+2}$, $Ba^{+2}$ to substitute for $Mg^{+2}$ partially, thereby shifting the radiation maximum value of $Eu^{+2}$ from blue-green to orange-yellow. The second luminescent chromaticity control means is the chromaticity control of the excitation ion $Ce^{+3}$. When the major radiation of $Ln^{+3}$—$Ce^{+3}$ ion pair is concentrated on orange-red color area, using terbium or holmium ion to partially substitute for Lu in the expanded lattice, a shift of the maximum value of the shortwave in the radiation spectrum is seen. These two ions show self-absorption phenomenon at yellow-green of the spectrum, and therefore they are capable of correcting the radiation strength of the phosphor.

The following indicates an unusual measure of the present invention to control the phosphor spectrum composition. This measure is to add different valence $N^{-3}$ and $F^{-1}$ to the oxytropysm lattice. The activator $Ce^{+3}$ or $Eu^{+2}$ symmetrically surrounds $O^{-2}$, the width of the radiation spectrum half-wave is converged. However, when the activator ion $Ce^{+3}$ or $Eu^{+2}$ surrounds $O^{-2}$ asymmetrically, the width of the radiation spectrum curve is widened. This widening is observed in the spectrum at yellow and red and increases the radiation performance of the phosphor. Another new measure of controlling the phosphor luminescence chromaticity according to the present shows a great concern with the variation of the phosphor excitation spectrum, and is determined subject to the property of the activation ion. On one hand, electric charge transfers at yellow-orange in the spectrum from $O^{-2}$ toward $Ce^{+3}$. On the other hand, $Eu^{+2}$—$O^{-2}$ charge transfer band absorbs at blue-green and radiates at green-yellow. Correspondingly, changing the phosphor excitation region causes variation of the radiation spectrum of the activation ion. If there is only one activation ion in the phosphor composition, for example, $Eu^{+2}$, bright green luminescence is obtained. At this time, the radiation of the phosphor excited by cerium is concentrated on yellow-orange and red.

When an activation ion pair, for example, $Cu^{+1}$ and $Ce^{+3}$ is used, strong orange-red band is observed in the radiation, and the spectrum maximum value is at the wavelength $\lambda=625$ nm. High spectrum maximum value $\lambda=628$ nm fits the activation ion pair $Cu^{+1}$—$Mn^{+2}$.

With respective to the ion pair architecture $Eu^{+2}$—$Mn^{+2}$, an approximately equal maximum value is observed. When compared to the luminescence of the long wave radiation of the second activation ion $Mn^{+2}$, this ion pair is characterized by its short-wave maximum value at $\lambda=475$ nm. Obviously, d-f activation ion $Ce^{+3}$ has a broad half-wave width, $\lambda_{0.5}>115$ nm, substantially greater than the pure d-ion half-wave width of $Mn^{+2}$ type $\lambda_{0.5}\leq90$ nm. Radiation sensitization of $Cu^{+1}$ or $Ag^{+1}$ shows insignificance on radiation spectrum half-wave width.

It is to be pointed out that the luminescence of $Ce^{+3}$ enables the phosphor of the present invention to have high quantum efficiency at orange-read region. This efficiency value is the greatest when compared to many known phosphors such as strontium-manganese chlorate, cadmium-manganese silicate, europium-manganese bi-silicate. The silicate phosphor provided by the present invention is characterized in that when phosphor lattice contains Ln=Lu and/or Yb and/or Er and/or Ho, the stoichiometric number $y\geq0.1$ and the cubic lattice of the chemical radical of the phosphor has the parameter value $a\leq11.95$ A; when the phosphor lattice has formed therein Ln=Lu and/or Sc ionic lattice, the stoichiometric number $y\leq0.1$ atomic fraction and has a great concern with the concentration of the added $N^{-3}$ and $F^{-1}$. At this time, the phosphor lattice parameter value is reduced to $a\leq11.90$ A.

The parameter value of the phosphor provided by the present invention is not a constant. As indicated above, it is determined subject to the degree of substitution of the larger size ion for $Mg^{+2}$, such as $Ca^{+2}$, $Sr^{+2}$ and $Ba^{+2}$. On the other hand, when Lu in the substrate is substituted by Er, Ho and Sc, the minimum parameter value "a" of the Lu phosphor lattice is increased to be a=11.88~11.99 A. Because of lattice parameter is reduced, the density is reduced, causing increase of the internal crystal field intensity. Based on this reason, optical transfer processing in $Eu^{+2}$, $Mn^{+2}$ or $Ce^{+3}$ needs to pass through the effect of a great force of crystal field force. Increasing the phosphor radiation quantum efficiency at yellow and orange-red region in the visible spectrum can achieve this result. This is a high value. When considered the $Y_3Al_5O_{12}$:Ce based standard phosphor, the quantum efficiency is 0.94~0.95.

The silicate phosphor provided by the present invention is characterized in that in the concentration of the activator $A\kappa^{+n}$ d-element, n=1, 2 or 3, x=0.0001~0.1 atomic fraction, the material after-glow duration is $\tau_e\leq1$ μs, and the after-glow duration will be $\tau_c\leq1$ μs when the phosphor is excited by $Eu^{+2}$ and $Mn^{+2}$.

According to the study of the present invention, the dynamic characteristic curve of the phosphor shows a great concern with the after-glow value, wherein a special light source and pulse excitation method must be employed. In one example, $\lambda=331$ nm $N^{2-}$ laser with pulse duration 30 μs is employed. The luminance of $Eu^{+2}$, $Mn^{+2}$, $Cu^{+1}$ in the silicate substrate tends to be excited by this wavelength. With respect to the excitation of the greater long wave, i.e., the $Ce^{+3}$ absorption region, blue pulse laser of $\lambda=455$ nm and pulse duration $\tau=100$ μs is necessary. By means of vacuum photo-electric amplifier, the excited photoluminescent signal is emitted to a high-speed oscilloscope for analysis. The parameter of "after-glow duration" is significant to phosphor property prediction at a high excitation powder. If the phosphor's after-flow duration is short, for example, $\tau_e \leq 1$ μS, it loses its excitation energy soon and can be excited again. When the after-glow duration $\tau_e \leq 1$ μs, the proposed phosphor can be excited $10^6$ times within one second. Under this short duration, stagnation after growth of excitation power and radiated photoluminescence power, the nonlinear excitation becomes the smallest, normally $W_{radiation}/W_{excitation} \leq 0.95 \sim 0.97$. If the phosphor after-glow duration is long, for example, $\tau_e = 10$ μs relative to $Mn^{+2}$, it may receive high linearity excitation pulse below 100 kHz, i.e., the ratio between radiation power and excitation power. When tried to use a pulse wave over 100 kHz to excite the material proposed by the present invention, the phosphor radiation power shows non-linearity, and the value will be $W_{radiation}/W_{excitation} \leq 0.50$. The luminescence is saturated soon, and then the supplementary excitation is transferred into heat, resulting in distinguishing of luminescence.

It has been for sure that the phosphor proposed by the present invention has high excitation linearity, and the activator in the phosphor is a short attenuation ion, such as $Ce^{+3}$, $Eu^{+3}$, $Cu^{+1}$. Similarly, when the phosphor proposed by the present invention is excited by an ion $Eu^{+2}$—$Mn^{+2}$ or $Ag^{+}$—$Mn^{+2}$ pair, the phosphor provides a saturated excitation radiation. The luminescence saturation of the ion pair $Ce^{+3}$—$Mn^{+2}$ is relatively lower. These materials require a special synthesis. A detailed analysis in this regard is not necessary. According to test, when the phosphor is excited by $Ce^{+3}$ and the excitation power reaches $W=10$ $W/cm^2$, an effective radiation is produced. The phosphor with activator $Eu^{+2}$ can sustain this excitation power. With respect to the two phosphors excited by $Eu^{+2}$—$Mn^{+2}$, the extreme value of the excitation power is $W=2.5\sim3V$, sufficient for the working of white LED.

The silicate phosphor proposed by the present invention having the aforesaid high performance features is characterized in that the phosphor is excited by $\lambda=365\sim475$ nm short-wave radiation of InGaN heterostructure, at this time Stoksov zamik (Stokes Shift) is proportional to the maximum value of the long wave $\lambda=55\sim145$ nm excitation radiation, in which Stokes shift is the difference in wavelength between positions of the band maxima of the absorption of the phosphor and luminescence spectra of the same electronic transition. It is to be understood that the excited spectrum is determined subject to the activator. The excitation of the phosphor containing $Eu^{+2}$, the major excited band is at $\lambda=365\sim400$ nm near ultraviolet region. The radiation of the activator is at blue-green region of the spectrum. At this time, the new Stokes shift value reaches 120 nm. The phosphor excited by $Eu^{+2}$ is strongly activated by $\lambda=475$ nm blue LED radiation, and at the same time the Stokes shift value is reduced to 50~55 nm. The phosphor proposed by the present invention is not only excitable by semiconductor heterostructure. There are other excitation forms. This is an important feature. A phosphor contains $Ce^{+3}$, the major excitation band is at the blue region of In—GaN heterostructure radiation. At this time, the Strokes shift value of $Ce^{+3}$-phosphor is greater than that of $Eu^{+2}$-phosphor, i.e., $\lambda=120\sim145$ nm. By means of adding the sensitizer $Cu^{+1}$, photoluminescence can be enhanced. This effect can also be achieved by means of adding $Er^{+3}$ and $Ho^{+3}$ to the material substrate.

The color of the phosphor proposed by the present invention is studies hereinafter. The color of the phosphor is determined subject to the type of the activator. Under the excitation of $Eu^{+2}$, the phosphor shows bright green-yellow color. Under the excitation of $Ce^{+3}$, the phosphor shows yellow-light tan color. Phosphor having this color strongly absorbs blue radiation, and is excited $Ce^{+3}$ by to produce orange-red luminescence. This phosphor composition shows an excellent effect in making a LED having warm white radiation that is because making a standard LED lacks a great fraction of orange-red radiation.

The phosphor proposed by the present invention is in conformity with In—Ga—N based blue light semiconductor heterostructure that radiates at $\lambda=450\sim475$ nm. Under this condition, phosphor $Mg_2Me^{+2}_{0.5}Ln_3Si_{2.5}O_{12-2y}N^{+3}F^{-1}_y$ has a yellow-orange luminescence, reaching the warm white radiation that comforts human eyes. In 1931, the International Commission on Illumination (CIE) defined three standard primaries, called x, y and z. The corresponding functions are defined: x=0.435, y=0.405; x=0.430, y=0.440; x=0.465, y=0.415; x=0.470, y=0.425. Same as the phosphor proposed by the present invention, adding YAG-phosphor of standard $(Y,Gd,Ce)_3Al_5O_{12}$ to the spectrum conversion layer can have the aforesaid warm white luminescence. With respect to the details of adding standard green-yellow phosphor to the spectrum conversion layer, a further discussion will be described later.

The silicate phosphor proposed by the present invention can be used with blue radiation In—Ga—N heterostructure, and joined with Ga—In—N semiconductor heterostructure. This heterostructure radiates at $\lambda=415\sim410$ nm violet region and $\lambda=410\sim385$ nm near violet region. At this time, the whole radiation color of the LED is white-yellow or warm white-light yellow. The LED has another structure, characterized in that it includes two parallel heterostructures that radiate at near violet, violet and blue regions and covered by silicate phosphor spectrum conversion layer. The phosphor radiates at light green-yellow-orange color region, and works with the heterostructures to produce white light substantially similar to an incandescent light source of which the color coordinates is x=0.310, y=0.340.

After understanding of the properties of the silicate phosphor proposed by the present invention, the preparation of the material is outlined hereinafter. Because the material contains a big amount of oxide, the optimal preparation method is the high-temperature solid phase synthesis under the presence of a weak reduction air pressure. It must be taken into consideration that $N^{-3}$ and $F^{-1}$ exist in the phosphor composition.

During synthesis of the material proposed by the present invention, IIA, IIIA, IVA group elements of oxide, hydroxide, carbonate, oxalate and hydroxyl oxalate. They can be MgO, $CaCO_3$, $Sr(COO)_2$, $SiO_2$, $Ln_2O_3$, $Sc_2O_3$ etc. The required nitride can be $Mg_3N_2$, $Ca_3N_2$, $Sr_3N_2$, LnN, ScN. $F^{-1}$ may be added to the phosphor. It exists in the form of a high melting point fluoride, such as $MgF_2$, $CaF_2$, $SrF_2$ and $BaF_2$. It can be added to the phosphor in the form of a gas phase fluoride ion, such as $CaSiF_6$ or $SrSiF_6$ silicon fluoride.

The original composition should have a high purity, normally above 99.5%. According to the present invention, special activators are used, they are solid solutions of II group and III group elements. Thus, the main activators europium and magnesium exist in professionally prepared $Ca_{0.95}Eu_{0.04}Mn_{0.1}CO_3$, which is prepared by means of co-precipitation of the nitride of the aforesaid elements. Activator $Ce^{+3}$ exists in $(Ln_{1.98}Ce_{0.02})_2(COO)_3 \cdot 6H_2O$ prepared by means of co-precipitation of nitride solution of the aforesaid elements and oxalic acid $COH_2$. Because the oxidation degree of the excitation ions in the material is higher than the final oxide in which these ions exist, the mixture in the weak reduction environment during synthesis is hydrogen and nitrogen (5:95) or ionized ammonia or CO.

The full-degree of reaction of the solid phase synthesis is determined subject to the heat treatment temperature of the reaction stove. All the requisite components are mixed subject to the designed stoichiometric ratio. The mixture is then fed into an alundum crucible or zirconium crucible in the reaction stove, and the feed is compacted under the pressure of 1 atm/cm². The crucible is heated by an electric heater. Under the reduction gas pressure $H_2+N_2$ (5:95), the temperature rising speed is 4~5-degrees per minute. According to the present invention, the optimal temperature range is T=1200~1400° C. At the maximum temperature, the reaction stove durates 0.5~10 hours.

The synthesized produce and the reaction stove are cooled down, and then the product is removed from the crucible and then ground in an alundum planetary ball grinder. The ground product is rinsed with diluted hydrochloric solution (1:5), and then processed with 0.1% $ZnSO_4$ and $Na_2O.2SiO_2$ to form a nano scale $ZnO-nSiO_2$ thin film on the obtained phosphor. Phosphor synthesis examples are described hereinafter.

Example I

Mix 0.025M MgO, 0.025M $Lu_2O_3$, 0.0047M $(Sc,Ce)_2(C_2O_2)_3$, 0.024M $SiO_2$, 0.001M $Si_3N_4$ and 0.0005M $MgF_2$ in a 2000 r.p.m. alundum planetary ball grinder. The material thus obtained is then loaded in an alundum crucible. The alundum crucible carrying the material is put in a SiC-based heating furnace into which a flow of $H_2+N_2$ (5:95) gas is supplied at the speed of one liter per minute. The reaction stove is heated from room temperature to 140° C. at the speed of 5° C./minute, and kept for 4 hours when reached the desired temperature. Thereafter, the reaction stove is cooled down to room temperature. The product thus obtained from the crucible is put in an alundum planetary ball grinder. The ground product is put with $ZnSO_4$ water solution (1% solution and 1 mm/g ground product) in a blender. During blending, 0.1% sodium silicate is added to the suspension. The precipitated solid matter is rinsed with pH≈0.7 filtered water. The phosphor thus obtained is dried at T=120° C. for 4 hours and then filtrated through a 500 meshes Crimplene screener.

The phosphor thus prepared has yellow-brown color and excited by blue LED. Use a professional spectrophotometer from "Tri-color" to measure the optical parameters of the phosphor. The measured results show color coordinates x=0.58, y=0.40, relative value of brightness L=16000 units, spectrum maximum value λ=625 nm, half-wave width=115 nm. When LED (λ=460 nm) radiates blue light, the prepared phosphor, when compared with a conventional standard phosphor, shows quantum efficiency 60%. Under this excitation condition, value of the standard phosphor $(Y,Gd,Ce)_3Al_5O_{12}$ is 92%.

Example II

Mix 0.02M $MgCO_3$, 0.00495M $(Ca,Eu)CO_3$, 0.028M $Lu_2O_3$, 0.002M $Sc_2O_3$, 0.0245 M $SiO_2$, 0.00015M $Si_3N_4$, 0.0005M $CaF_2$ in a 2000 r.p.m. alundum planetary ball grinder for 30 minutes. The material thus obtained is then loaded in a zirconium oxide crucible and compacted. The crucible is then put in a reaction stove and heated to 1380° C. and kept at this temperature for 4 hous. Thereafter, the reaction stove is cooled down to T=200° C. The product thus obtained is rinsed with diluted hydrochloric solution (1:5), and then processed with 0.1% $ZnSO_4$ and 0.1% $Na_2O.2SiO_2$. The processed phosphor thus obtained is dried at T=120° C. for three hours and screened through a 500=mesh screener.

Analyzing the frequency distribution, one synthesized phosphor sample shows an average diameter $d_{average}$=7.5 μm, the diameter of 25% fraction $d_{25}$=4.2 μm. It is to be understood that the size of the dispersed composition of the standard garnet phosphor $(Y,Gd,Ce)_3Al_5O_{12}$ is relatively smaller.

The spectrum maximum value of the phosphor prepared according to this example is at λ=610 nm orange region, half-wave width λ=120 nm, radiation color coordinates x=0.59, y=0.395, relative luminescence brightness L=179000, about 71% of a standard yttrium garnet phosphor.

Example III

Using a planetary ball grinder to grind 0.02M MgO, 0.0048M $SrCO_3$, 0.0002 M $EuCO_3$, 0.0048M SrCO and 0.0295M $Lu_2(C_2O_2)_3$ and 0.0005 M $Ce_2(C_2O_2)_3$. 0.0002M $Mg_3N_2$ and 0.0025 M $SiO_2$ 0.0002 M $SrF_2$ are added to the compound. The material is put in an alundum crucible and compacted, and then heated to temperature T=1250° C. for 2 hours, and then the temperature is raised to T=1400° C. After cooling, the material is rinsed with diluted hydrochloric solution (1:5), and then processed with $ZnO.nSiO_2$.

The phosphor thus obtained shows two extremes in spectrum, i.e., λ=480 nm and λ=625 nm. When the phosphor is excited simultaneously by near ultraviolet and blue radiation LEDs, the luminescence brightness L=240000, about 100% of the luminescence brightness of a standard yttrium phosphor that is excited by λ=465 nm.

Following Table I shows the stoichiometric parameter data of the phosphor prepared according to the present invention.

TABLE I

| Item | Phosphor composition | Luminance Color | Color coordinates x y | Max. value | Relative brightness % |
|---|---|---|---|---|---|
| 4 | $Mg_{2.5}Lu_{2.95}Ce_{0.05}Si_{2.5}O_{11.84}N^{-3}{}_{0.08}F^1{}_{0.08}$ | Light yellow-orange yellow | 0.59 0.40 | 630 | 68 |
| 5 | $Mg_2Ca_{0.46}Eu_{0.02}Lu_{2.90}Er_{0.1}Si_{2.5}O_{11.9}N^{-4}{}_{0.05}F^{-1}Mn_{0.01}$ | Yellow-orange yellow | 0.600 0.39 | 510 630 | 72 |
| 6 | $Mg_2Cr_{0.47}Eu^{+1}{}_{0.01}Cu^{+1}{}_{0.01}Mn^{+2}{}_{0.01}Lu_{2.9}Ho_{0.1}Si_{2.5}O_{11.9}N_{0.05}F_{0.05}$ | Yellow-orange yellow | 0.595 0.390 | 512 635 | 74 |
| 7 | $Mg_2Ba_{0.5}Lu_{2.95}Ce_{0.04}Ag^{+1}Si_{2.5}O_{11.94}N^{-3}{}_{0.03}F^{-1}{}_{0.03}$ | Orange-yellow | 0.610 0.375 | 630 | 70 |
| 8 | $Mg_2Ca_{0.48}Cu^{+1}{}_{0.01}Mn_{0.01}Si_{2.5}O_{11.96}N^{-3}{}_{0.02}F^{-1}{}_{0.02}$ | Orange-yellow | 0.615 0.370 | 632 | 76 |

TABLE I-continued

| Item | Phosphor composition | Luminance Color | Color coordinates x y | Max. value | Relative brightness % |
|---|---|---|---|---|---|
| 9 | $Mg_2Sr_{0.5}Lu_{2.95}Ce_{0.04}Ag_{0.01}Si_{2.5}O_{11.96}N_{0.02}F^{-1}_{0.02}$ | Orange-yellow | 0.618 0.365 | 630 | 78 |
| 10 | $Mg_2Sr_{0.5}Lu_{2.95}Yb_{0.01}Ce_{0.03}Cu^{+1}_{0.01}Er_{0.1}O_{11.94}N_{0.03}F_{0.03}$ | Orange-yellow | 0.620 0.370 | 632 | 80 |
| 11 | $Mg_2Ba_{0.48}Eu_{0.01}Cu_{0.01}Lu_{2.9}Er_{0.1}O_{11.9}N_{0.05}F_{0.05}$ | Orange-yellow | 0.505 0.472 | 632 620 | 82 |
| 12 | $(Y, Gd, Ce)_3Al_5O_{12}$ | Yellow-orange yellow | 0.52 0.46 | 570 | 120 |

The invention also provides a warm white LED, which is prepared from a blue light semiconductor nitride heterostructure. The phosphor exists in the polymer layer and makes an optical contact with the heterostructure. The heterostructure radiates at λ=410~470 nm. The LED is characterized in the phosphor has the aforesaid phosphor composition and the phosphor powder is blended with garnet-phosphor capable of producing a warm white radiation.

When using in a blue or complex radiation LED, the phosphor is contained in epoxy polymers, containing —C—C- radical of which the polymerization degree is M=10000-20000 carbon units. The content in the polymers varies within 5~50%. The optical test results of the LEDs are indicated in the following Table II.

TABLE II

| Item | Phosphor concentration in compound | Luminescence strength (cd) | Emergence angle 2θ | Color coordinates x | y |
|---|---|---|---|---|---|
| 1 | 5% + 95% Epoxy polymers | 1.2 | 60 | 0.435 | 0.405 |
| 2 | 10% + 90% Epoxy polymers | 1.4 | 60 | 0.442 | 0.410 |
| 3 | 15% + 85% Epoxy polymers | 1.6 | 60 | 0.460 | 0.420 |
| 4 | 25% + 75% Epoxy polymers | 1.5 | 60 | 0.48 | 0.43 |
| 5 | 35% + 65% Epoxy polymers | 1.3 | 60 | 0.450 | 0.42 |
| 6 | 50% + 50% Epoxy polymers | 1.0 | 60 | 0.425 | 0.43 |
| 7 | 15% $(Y, Gd, Ce)_3Al_5O_{12}$ | 2.0 | 60 | 0.365 | 0.380 |

From the cited data, we can obtain the conclusion that combination of either type of phosphor prepared according to the present invention with λ=460 nm In—Ga—N standard blue heterostructure can produce warm white luminescence. It is to be understood that when the emergent angle is the same, the luminescence brightness of the silicate garnet radiation according to the present invention is lower than the conventional standard phosphor. To overcome this drawback, the invention mixes two inorganic phosphors, i.e., $(Y,Gd,Ce)_3Al_5O_{12}$ and the silicate garnet sample. The LED optical parameters are measured and indicated in the following Table III.

TABLE III

| Phosphor sample | Phosphor concentration in compound | Luminescence strength (cd) @J = 20 mA | Color coordinates x | y |
|---|---|---|---|---|
| 8 | 20% sample 8 + 80% $(Y, Gd, Ce)_3Al_5O_{12}$ | 2.2 | 0.435 | 0.410 |
| 9 | 40% sample 9 + 60% $(Y, Gd, Ce)_3Al_5O_{12}$ | 2.1 | 0.435 | 0.420 |
| 10 | 50% sample 10 + 50% $(Y, Gd, Ce)_3Al_5O_{12}$ | 2.1 | 0.435 | 0.415 |
| 11 | 80% sample 11 + 20% $(Y, Gd, Ce)_3Al_5O_{12}$ | 2.0 | 0.435 | 0.405 |

All the prepared LEDs use a silicon polymer of molecular weight M=18000 carbon units and polymerization degree m=500. Obviously, when compared with the conventional standard phosphor, the two compounds, YGA (yttrium-aluminum garnet) and silicate garnet have relatively higher luminescence brightness. According to test, all the provided LEDs show warm white tone, suitable for illumination application. As stated above, the LED that achieves the aforesaid advantages of the present invention is characterized in that the silicate garnet substrate-based phosphor prepared according to the present invention is blended with YGA $(Y_{0.80}Gd_{0.18}Ce_{0.02})_3Al_5O_{12}$ at 20%:80%~80%:20% so that the LED has warm white radiation of which the color coordinates is within the range of 0.41<x≦0.45, 0.405<y≦0.43.

Same as the LED test sample, the applicant of the present invention made a high power LED using a high quality semiconductor In—Ga—N heterostructure, and the electric power is 1.2~1.6 W. Epoxy resin adhesive based on two phosphors was coated on the surface of the heterostructure of which the surface area was 1×1 mm². The concentration in the surface light conversion layer of the heterostructure and its radiation end face was about 120~130 μm. When the mass ratio between silicate and aluminum garnet was 1:1, the concentration in the polymer was 16%. When heterostructure power supply was W=1200 mw, the luminescence intensity was J=300 cd, 2θ=30°. The radiation color coordinates of the test LED sample was x=0.440, y=0.405, and its total luminous flux was F=120 lm. Under this condition, the luminescence efficiency of the LED reached 100 lm/W. When the total electric power of the LED was increased to 1.6 W, the luminous flux become F=155 lm, and the luminescence efficiency become 97 lm/W. The high phosphor and LED optical parameters are obtained because of the use of phosphor compound mixture of silicate garnet phosphor and aluminum garnet phosphor. When the total excitation power is 1.2 W, the color temperature of the total LED radiation is T≦4000K and the lumen flux is F>120 lm.

In conclusion, the high-performance yellow-orange luminescent silicate phosphor substantially improves the material radiation luminescence efficiency, i.e., the lumen equivalent value; when temperature surpassed 100° C., the thermal stability of the phosphor is improved; by means of modifying the radiation spectrum of the phosphor, new type materials are created to radiate at green-yellow, yellow-orange and orange-red regions. Therefore, the invention effectively improves the drawbacks of a conventional orange phosphor and a warm white LED based on this conventional orange phosphor.

Although particular embodiments of the invention have been described in detail for purposes of illustration, various modifications and enhancements may be made without departing from the spirit and scope of the invention.

What is claimed is:

1. A yellow-orange silicate phosphor used in a warm-white semiconductor, comprising a silicon oxide substrate having a garnet crystal architecture and excited by d-element, wherein said silicon oxide substrate has the stoichiometric equation $Mg^{+2}_{2.0}Me^{+2}_{0.5}Ln_3Si_{2.5}O_{12-2y}N_yF_y:Ak_x^{+n}$ in which Ln=Sc and/or Lu and/or Yb and/or Er and/or Ho; $Me^{+2}$=Ca and/or Sr and/or Ba; the phosphor is excited d,f-element ions that came from $Ak^{+n}=Cu^{+1}, Ce^{+3}, Eu^{+2}, Ag^{+1}, Mn^{+2}$, and formed of one single element or a pair of elements, i.e., $Cu^{+1}+Ce^3$, $Cu^{+1}+Mn^{+2}$ or $Ag^{+1}+Ce^{+3}$; the phosphor produces a yellow-orange luminance radiation at a specific wavelength when excited by the shortwave light of a nitride semiconductor heterostructure, and at the same time these two radiations are mixed to produce warm white light.

2. The yellow-orange silicate phosphor as claimed in claim 1, wherein the stoichiometric index of the stoichiometric equation is x=0.000~10.1, y=0.001~0.2.

3. The yellow-orange silicate phosphor as claimed in claim 1, wherein said specific wavelength is $\lambda$=590 nm.

4. The yellow-orange silicate phosphor as claimed in claim 1, wherein the specific color temperature of the warm white light is T≦5000K.

5. The yellow-orange silicate phosphor as claimed in claim 1, wherein the cubic lattice of the substrate of the phosphor added with Ln=Lu, Yb, Er, Ho has lattice parameter a≦11.95 A, stoichiometric index value y≧0.1; or stoichiometric index value y<0.1 and lattice parameter a≦11.9 A when added with Ln=Lu and/or Sc.

6. The yellow-orange silicate phosphor as claimed in claim 1, wherein the concentration of the d-element $Ak^{+n}$ that excites the substrate of the phosphor is x=0.0001~0.1 atomic fraction wherein n=1, 2 or 3 and under this condition, the after-glow duration is τ≦1 μs when the phosphor is excited by $Ce^{+3}$ and $Cu^{+1}$ or τ≧1 μs when excited by $Mn^{+2}$ and $Eu^{+2}$.

7. The yellow-orange silicate phosphor as claimed in claim 1, wherein when the phosphor is excited by the shortwave $\lambda$=365~475 nm of InGaN heterostructure, the radiation wave shift $\lambda$=55~145 nm is proportional to the maximum value of the excitation wave.

8. The yellow-orange silicate phosphor as claimed in claim 1, wherein the phosphor has the stoichiometric equation composition of $Mg_{2.5}Lu_{2.5}Ce_{0.03}Sc_{0.47}Si_{2.5}O_{11.86}N_{0.07}F_{0.07}$, capable of producing wideband orange-yellow photoluminescence $\lambda$=600 nm and half wave radiation $\lambda$=120 nm.

9. The yellow-orange silicate phosphor as claimed in claim 1, wherein the phosphor has the stoichiometric equation $Mg_2Ca_{0.48}Eu_{0.02}Lu_{2.89}Sc_{0.21}Si_{2.5}O_{11.94}N^{-3}_{0.03}F^{-1}_{0.03}$ of dark orange-yellow powder and is excited by the shortwave of nitride heterostructure to provide orange-yellow color of the maximum spectrum value $\lambda$=620 nm.

10. The yellow-orange silicate phosphor as claimed in claim 1, wherein the phosphor has the stoichiometric equation of $Mg_2Sr_{0.5}Lu_{2.95}Sc_{0.05}Si_{2.5}O_{11.96}N^{-3}_{0.02}F^{-1}_{0.02}$ and is excited by the shortwave $\lambda$=465 nm to provide red-orange radiation of the maximum spectrum value $\lambda$=640 nm.

11. A warm white semiconductor comprising a blue luminescence semiconductor nitride heterostructure and a phosphor compound kept in optical contact with said blue luminescence semiconductor nitride heterostructure, said blue luminescence semiconductor nitride heterostructure radiating at $\lambda$=410~470 nm, wherein said phosphor compound is a mixture of the yellow-orange silicate phosphor as claimed in claim 1 and a garnet phosphor, and capable of producing a warm white radiation.

12. The warm white semiconductor as claimed in claim 11, wherein said garnet phosphor has the stoichiometric composition of $(Y_{0.8}Gd_{0.18}Ce_{0.02})_3Al_5O_{12}$.

13. The warm white semiconductor as claimed in claim 11, wherein said yellow-orange silicate phosphor and said garnet phosphor are mixed within the range of 20:80~80:20.

14. The warm white semiconductor as claimed in claim 11, wherein said warm white radiation is within the color coordinates range of 0.41≦x≦0.45 and 0.400≦y≦0.43.

* * * * *